United States Patent
Cho et al.

(10) Patent No.: US 12,543,336 B2
(45) Date of Patent: Feb. 3, 2026

(54) METHODS OF MANUFACTURING SEMICONDUCTOR DEVICES

(71) Applicant: Samsung Electronics Co., Ltd., Suwon-si (KR)

(72) Inventors: Keunhwi Cho, Seoul (KR); Jinkyu Kim, Boryeong-si (KR); Myunggil Kang, Suwon-si (KR); Dongwon Kim, Seongnam-si (KR); Kisung Suh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 634 days.

(21) Appl. No.: 17/863,741

(22) Filed: Jul. 13, 2022

(65) Prior Publication Data
US 2023/0131215 A1    Apr. 27, 2023

(30) Foreign Application Priority Data
Oct. 26, 2021   (KR) .................... 10-2021-0143382

(51) Int. Cl.
*H10D 30/01*    (2025.01)
*H10D 30/62*    (2025.01)
(Continued)

(52) U.S. Cl.
CPC ..... *H10D 30/0245* (2025.01); *H10D 30/6211* (2025.01); *H10D 30/6219* (2025.01);
(Continued)

(58) Field of Classification Search
CPC .......... H10D 30/0245; H10D 30/6211; H10D 84/013; H10D 84/0158; H10D 30/6219; H10D 84/0128; H10D 84/038
See application file for complete search history.

(56) References Cited

U.S. PATENT DOCUMENTS 9,601,585 B2   3/2017   Chu et al.
9,634,092 B2   4/2017   Bhuwalka et al.
(Continued)

FOREIGN PATENT DOCUMENTS

JP      2005-086024 A      3/2005
KR      20160099445 A      8/2016
(Continued)

*Primary Examiner* — Christine A Enad
(74) *Attorney, Agent, or Firm* — Wolf, Greenfield & Sacks, P.C.

(57) ABSTRACT

A method of manufacturing a semiconductor device includes forming a semiconductor structure extending from a substrate in a first direction and having first and second regions; forming a sacrificial gate pattern intersecting the first region of the semiconductor structure and extending in a second direction perpendicular to the first direction; reducing a width in the second direction of the second region of the semiconductor structure exposed to at least one side of the sacrificial gate pattern; forming at least one recess portion by removing a portion of the second region of the semiconductor structure; forming one or more source/drain regions in the recess portion of the semiconductor structure on at least one side of the sacrificial gate pattern; forming at least one gap region by removing the sacrificial gate pattern; and forming a gate structure by depositing a gate dielectric layer and a gate electrode in the gap region.

19 Claims, 19 Drawing Sheets

(51) Int. Cl.
*H10D 84/01* (2025.01)
*H10D 84/03* (2025.01)

(52) U.S. Cl.
CPC ....... *H10D 84/0128* (2025.01); *H10D 84/013* (2025.01); *H10D 84/0158* (2025.01); *H10D 84/038* (2025.01)

(56) References Cited

U.S. PATENT DOCUMENTS

| | | | |
|---|---|---|---|
| 10,319,843 | B2 | 6/2019 | Sell |
| 10,930,649 | B2 | 2/2021 | Kang et al. |
| 2005/0169096 | A1 | 8/2005 | Lee et al. |
| 2011/0012125 | A1 | 1/2011 | Nicholas et al. |
| 2016/0240681 | A1* | 8/2016 | Ching ................ H10D 30/6713 |
| 2016/0254348 | A1* | 9/2016 | Bhuwalka .............. H10D 30/62 257/288 |
| 2018/0315831 | A1* | 11/2018 | Li ...................... H10D 30/0243 |
| 2020/0176591 | A1 | 6/2020 | Wong et al. |
| 2020/0273757 | A1* | 8/2020 | Ng ..................... H10D 30/6212 |
| 2021/0126097 | A1 | 4/2021 | Ju et al. |

FOREIGN PATENT DOCUMENTS

| | | |
|---|---|---|
| KR | 20160104435 A | 9/2016 |
| KR | 20170001950 A | 1/2017 |
| KR | 20180121322 A | 11/2018 |
| KR | 10-2020-0010918 A | 1/2020 |

\* cited by examiner

METHODS OF MANUFACTURING SEMICONDUCTOR DEVICES

CROSS-REFERENCE TO RELATED APPLICATION(S)

This application claims benefit of priority to Korean Patent Application No. 10-2021-0143382 filed on Oct. 26, 2021, in the Korean Intellectual Property Office, the disclosure of which is incorporated herein by reference in its entirety.

BACKGROUND

The present disclosure relates to methods of manufacturing semiconductor devices.

As demand for high performance, high speed, and/or multifunctionality of a semiconductor device increases, the degree of integration of semiconductor devices has increased. It may be beneficial to implement patterns having a fine width or a fine distance in manufacturing a semiconductor device having a fine pattern corresponding to the trend of high integration of semiconductor devices. In addition, in order to overcome the limitations of operating characteristics due to a reduction in size of planar metal oxide semiconductor field effect transistors (MOSFETs), efforts have been made to develop semiconductor devices including FinFETs having a three-dimensional channel structure.

SUMMARY

An aspect of the present disclosure is to provide semiconductor devices having improved electrical characteristics and reliability characteristics, and methods for manufacturing the same.

According to an aspect of the present disclosure, a method of manufacturing a semiconductor device may comprise: forming a semiconductor structure extending from a substrate in a first direction, and having a first region and a second region; forming a sacrificial gate pattern intersecting the first region of the semiconductor structure and extending in a second direction perpendicular to the first direction; reducing a width in the second direction of the second region of the semiconductor structure exposed to at least one side of the sacrificial gate pattern; forming at least one recess portion by removing a portion of the second region of the semiconductor structure; forming one or more source/drain regions in the at least one recess portion of the semiconductor structure on at least one side of the sacrificial gate pattern; forming at least one gap region by removing the sacrificial gate pattern; and forming a gate structure by depositing a gate dielectric layer and a gate electrode in the at least one gap region.

According to another aspect of the present disclosure, a method of manufacturing a semiconductor device may include: alternately stacking first layers and second layers on a substrate to form a stack structure; forming an active fin extending from the substrate in a first direction and a semiconductor structure comprising sacrificial layers and preliminary channel layers formed as the first layers and the second layers are patterned by etching the substrate and the stack structure; forming a sacrificial gate pattern intersecting the semiconductor structure and extending in a second direction perpendicular to the first direction; performing a first etching process so that a width in the second direction of the semiconductor structure exposed to at least one side of the sacrificial gate pattern is reduced; performing a second etching process to remove a portion of the semiconductor structure exposed to at least one side of the sacrificial gate pattern to form a recess portion exposing an upper surface of the active fin; performing an epitaxial growth process to form one or more source/drain regions on the active fin on at least one side of the sacrificial gate pattern; forming at least one gap region by removing the sacrificial layers and the sacrificial gate pattern; and forming a gate structure by depositing a gate dielectric layer and a gate electrode in the at least one gap region.

According to another aspect of the present disclosure, a method of manufacturing a semiconductor device may comprise: forming a first semiconductor structure extending in a first direction on an NMOS region of a substrate and a second semiconductor structure extending in the first direction on a PMOS region of the substrate; forming a plurality of sacrificial gate patterns intersecting the first and second semiconductor structures and extending in a second direction perpendicular to the first direction; forming a plurality of recess portions by removing a portion of the semiconductor structure from at least one side of each of the plurality of sacrificial gate patterns; forming a plurality of source/drain regions, each of the plurality of source/drain regions in a respective one of the plurality of recess portions;; forming a plurality of gap regions by removing the plurality of sacrificial gate patterns and at least some layers of the first and/or second semiconductor structures; and forming a gate structure by depositing a gate dielectric layer and a gate electrode in one or more of the plurality of gap regions, wherein at least one of the first and second semiconductor structures provide widths different from each other in the second direction in regions intersecting the plurality of sacrificial gate patterns, and wherein the method may further comprise performing an etching process to reduce a width in the second direction of each of the first and second semiconductor structures exposed to both sides of the plurality of sacrificial gate patterns, after the forming of the plurality of sacrificial gate patterns, and before the forming of the plurality of recess portions.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1A:
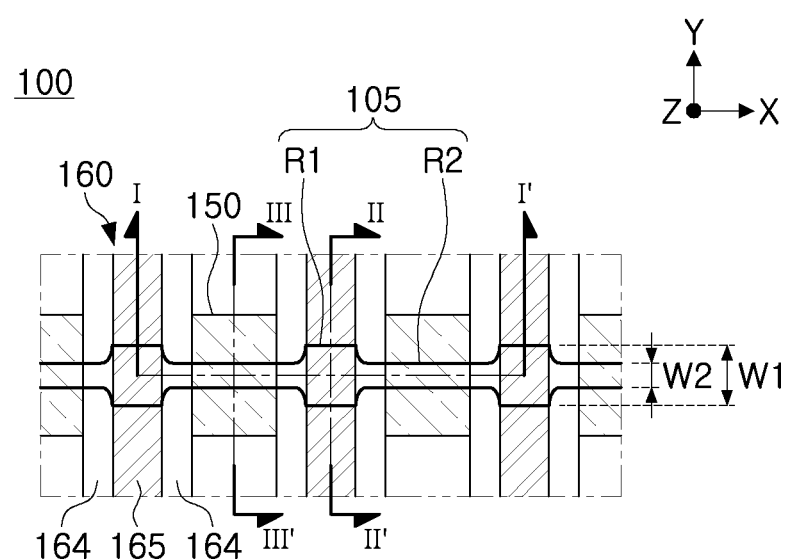
FIG. 1A is a plan view illustrating a semiconductor device according to example embodiments.

FIG. 1A is a plan view illustrating a semiconductor device according to example embodiments.

Figure 1B:
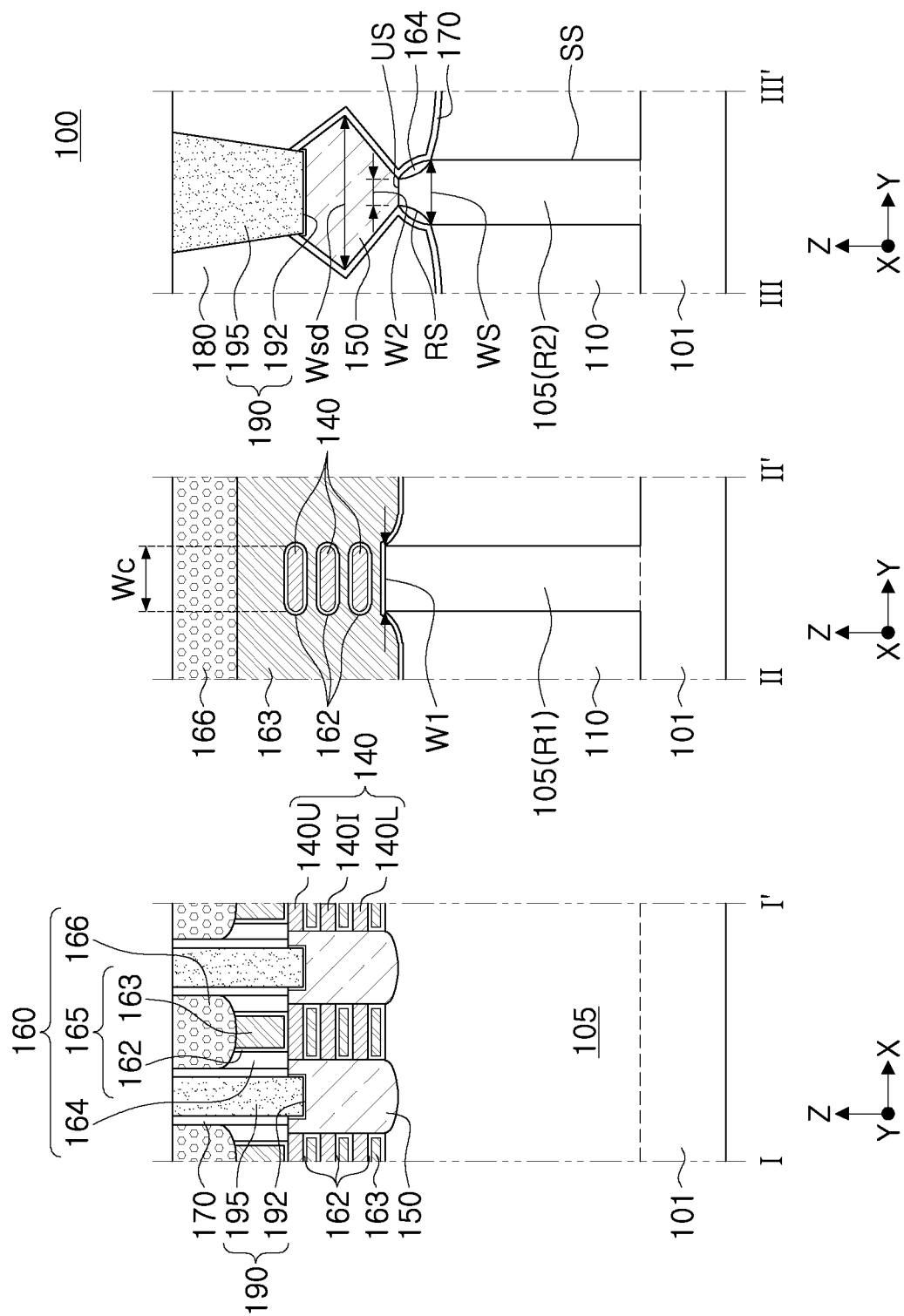
FIG. 1B is a cross-sectional view illustrating a semiconductor device according to example embodiments.

FIG. 1B is a cross-sectional view illustrating a semiconductor device according to example embodiments. FIG. 1B shows cross-sections of the semiconductor device of FIG. 1A, taken along lines I-I', II-II', and III-III'.

Referring to FIGS. 1A and 1B, a semiconductor device 100 includes a substrate 101, an active fin 105 and channel layers 140 on the substrate 101, and source/drain regions 150 on the active fin 105, gate structures 160 crossing the active fin 105, and a contact structure 190 connected to the source/drain regions 150. The semiconductor device 100 may further include a device separation layer 110, an insulating liner 170, and an interlayer insulating layer 180.

In the semiconductor device 100, the active fin 105 has a fin structure, and a gate 165 of the gate structure 160 may be between the active fin 105 and a lower channel layer 140L of the channel layers 140, between various ones of the channel layers 140, and above an upper channel layer 140U of the channel layers 140. In one embodiment, the channel layers 140 may include an upper channel layer 140U, an intermediate channel layer 140I, and a lower channel layer 140L. Accordingly, the semiconductor device 100 may include a multi-bridge channel FET (MBCFET™) formed by the channel layers 140, the source/drain regions 150, and the gate 165.

However, the present disclosure is not limited thereto, and may include, for example, a FinFET transistor in which the active fin 105 has a fin structure and a channel region of the transistor is formed in the active fin 105 intersecting the gate 165. The present disclosure may include, for example, a vertical FET in which an active fin 105 extends to be perpendicular to an upper surface of the substrate 101 and a gate structure 160 surrounds at least a portion of a side surface of the active fin 105. It will be understood that "an element A surrounds an element B" (or similar language) as used herein means that the element A is at least partially around the element B but does not necessarily mean that the element A completely encloses the element B.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like.

The active fin 105 may be defined by the device separation layer 110 in the substrate 101 and may extend in the first direction, for example, the X-direction. The active fin 105 may have a structure extending from the substrate 101. An upper end of the active fin 105 may extend to a predetermined height from an upper surface of the device separation layer 110. The active fin 105 may be formed as a portion of the substrate 101 or may include an epitaxial layer grown from the substrate 101. However, on both sides of the gate structure 160, the active fin 105 may be partially recessed in the substrate 101, and source/drain regions 150 may be on the recessed active fin 105. Accordingly, as shown in FIG. 1B, the active fin 105 may have a relatively high height below the channel layers 140 and the gate structure 160. In some embodiments, the active fins 105 may include impurities, and at least some of the active fins 105 may include impurities of different conductivity types, but the present disclosure is not limited thereto. A plurality of active fins 105 may be spaced apart from each other in the second direction, for example, the Y-direction.

The active fin 105 may have a first region 105(R1) and a second region 105(R2). The first region 105(R1) may be a region in which the active fin 105 intersects the gate 165 of the gate structure 160, and the second region 105(R2) may be on both sides of the first region 105(R1) in the X-direction. A portion of the second region 105(R2) may intersect a gate spacer layer 164, and source/drain regions 150 may be on the second region 105(R2) between the gate spacer layers 164 adjacent to each other. A first width W1 on an upper surface of the first region 105(R1) in the Y-direction may be wider than a second width W2 of an upper surface of the second region 105(R2) in the Y-direction. The first width W1 may be a minimum width of an upper portion of the active fin 105 in the first region 105(R1), and the second width W2 may be a minimum width of an upper portion of the active fin 105 in the second region 105(R2). The second width W2 may be smaller than a minimum width WS between side surfaces SS of the active fin 105 of the second region 105(R2). The second region 105(R2) may have a recessed side surface RS extending from the upper surface US having the second width W2 to the side surface SS of the active fin 105 of the second region 105(R2) at least partially covered by the device separation layer 110. The recessed side surface RS of the active fin 105 of the second region 105(R2) may be exposed from the device separation layer 110. A length of the second region 105(R2) in the X-direction may be longer than a length of the first region 105(R1) in the X-direction.

As shown in FIG. 1A, the active fin 105 may include a portion having a width decreasing in the Y-direction from the first region 105(R1) to the second region 105(R2). Although the width in the Y-direction may be changed as the active fin 105 is subjected to surface damage or a natural oxide film is removed in a subsequent etching process, the extent may be less than about 0.5 nanometers (nm) or less than about 1 nm from the surface of the active fin 105. In the present disclosure, since a separate etching process (refer to TP1' in FIG. 9A) of etching the active fin 105 to have the second width W2 smaller than the first width W1 is performed, a value obtained by subtracting the second width W2 from the first width W1 may be about 1 nm or more or about 2 nm or more.

When a semiconductor device is scaled down, resistance of the transistor is more significantly affected by resistance of regions other than that of a channel region, such as resistance of the source/drain regions, resistance between the source/drain regions and a contact structure, or resistance of the contact structure, etc. However, resistance of a device operating at a low voltage for low power is more significantly affected by the resistance of the channel region than the resistance of the regions other than the channel region. According to an embodiment of the present disclosure, in a low voltage device in which the resistance of the channel region is dominant in total resistance, the width of the channel region may be relatively increased by increasing the first width W1 of the first region 105(R1) of the active fin 105 below the channel layer 140 to be wider than the second width W2. As used herein, when the term Element A is "below" Element B is used, it may refer to the situation where Element A is closer to a reference plane, such as substrate 101, in a particular direction than Element B. Likewise, when the term Element A is "above" Element B is used, it may refer to the situation where Element A is further away from a reference plane, such as substrate 101, in a particular direction than Element B. Accordingly, since the resistance of the channel region, which plays a dominant role in the total resistance, may be relatively lowered, electrical characteristics of the semiconductor device may be improved. In addition, by adjusting the second width W2 to be narrower than the first width W1, a contact area between the source/drain region 150 and the active fin 105 may be reduced, and thus a parasitic capacitance therebetween may be reduced.

The device separation layer 110 may define the active fin 105 in the substrate 101. The device separation layer 110 may be formed by, for example, a shallow trench isolation (STI) process. The device separation layer 110 may expose upper side surfaces of the active fin 105. The device separation layer 110 may extend in the Y-direction and may at least partially cover side surfaces below the exposed upper side surfaces of the active fin 105. In some embodiments, the device separation layer 110 may include a region extending deeper into a lower portion of the substrate 101 between the active fins 105. The device separation layer 110 may have a curved upper surface having a higher level toward the active fin 105, but a shape of the upper surface of the device separation layer 110 is not limited thereto. The device separation layer 110 may be formed of an insulating material. The device separation layer 110 may be, for example, silicon oxide, silicon nitride, silicon oxynitride, or a combination thereof The channel layers 140 may include a plurality of layers spaced apart from each other in a direction perpendicular to the upper surface of the active fin 105 (for example, in the Z-direction) on the first region 105(R1) of the active fin 105. The plurality of layers includes three layers in the drawing, but the present disclosure is not limited thereto, and may include, for example, two layers or four layers. The channel layers 140 may be connected to the source/drain region 150 and spaced apart from the upper surface of the active fin 105. The channel layers 140 in some embodiments may have a width Wc equal to or similar to the first width W1 of the active fin 105 of the first region 105(R1) in the Y-direction, but the present disclosure is not limited thereto. The width Wc of the layers 140 may be smaller than the first width W1 in some embodiments. The channel layers 140 may be formed of a semiconductor material, and may include, for example, at least one of silicon (Si), silicon germanium (SiGe), and germanium (Ge). The channel layers 140 may be formed of, for example, the same material as the substrate 101.

The gate structure 160 may intersect the active fin 105 and the channel layers 140 on the active fin 105 and the channel layers 140 to extend in the second direction (for example, the Y-direction). Channel regions of transistors may be formed in the active fin 105 and the channel layers 140 intersecting the gate structure 160. As shown in FIB. 1B, the gate structure 160 may include a gate 165, the gate spacer layers 164 on side surfaces of the gate 165, and a gate capping layer 166 on an upper surface of the gate 165. The gate 165 may include a gate dielectric layer 162 and a gate electrode 163 on the gate dielectric layer 162.

The gate dielectric layer 162 may be between the active fin 105 and the gate electrode 163 and between the channel layers 140 and the gate electrode 163, and may be on, and/or cover, at least some of the surfaces of the gate electrode 163. For example, the gate dielectric layer 162 may surround all surfaces except the uppermost surface of the gate electrode 163. The gate dielectric layer 162 may extend between the gate electrode 163 and the gate spacer layers 164, but the present disclosure is not limited thereto. The gate dielectric layer 162 may include an oxide, nitride, or high-k material. The high-k material may refer to a dielectric material having a higher dielectric constant than that of a silicon oxide layer ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO$), hafnium aluminum oxide ($HfAl_xO_y$), and praseodymium oxide ($Pr_2O_3$).

The gate electrode 163 may extend upwardly from the channel layer 140, while filling spaces between the channel layers 140 above the active fin 105. The gate electrode 163 may be spaced apart from the channel layers 140 by the gate dielectric layer 162. The gate electrode 163 may include a conductive material, for example, a metal nitride such as titanium nitride (TiN), tantalum nitride (TaN), or tungsten nitride (WN), and/or a metal material such as aluminum (Al), tungsten (W), or molybdenum (mo), or a semiconductor material such as doped polysilicon. The gate electrode 163 may be formed of two or more multilayer structures.

The gate spacer layers 164 may be on both side surfaces of the gate electrode 163 and may extend in the Z-direction perpendicular to the upper surface of the substrate 101. In an example embodiment, the gate spacer layers 164 may include a portion having a curved outer surface so that an upper width of each of the gate spacer layers 164 is smaller than a lower width. The gate spacer layers 164 may insulate the source/drain regions 150 from the gate electrodes 163. The gate spacer layers 164 may have a multilayer structure according to embodiments. The gate spacer layers 164 may be formed of oxide, nitride, or oxynitride, and in particular, a low-k film, where low-k may refer to a dielectric material having the same or lower dielectric constant as compared to silicon oxide.

The gate capping layer 166 may be on the gate electrode 163. The gate capping layer 166 may extend in the second direction (for example, the Y-direction) along an upper surface of the gate electrode 163. Side surfaces of the gate capping layer 166 may be surrounded by gate spacer layers 164. An upper surface of the gate capping layer 166 may be substantially coplanar with an upper surface of the gate spacer layers 164, but the present disclosure is not limited thereto. The gate capping layer 166 may be formed of oxide, nitride, and oxynitride, and specifically, may include at least one of SiO, SiN, SiCN, SiOC, SiON, and SiOCN.

The source/drain regions 150 may be on the second region 105(R2) of the active fin 105 on both sides of the channel layers 140. The source/drain regions 150 may serve as a source region or a drain region of the transistor. The source/drain region 150 may be on, and/or cover at least a portion of, a side surface of each of the channel layers 140 and an upper surface of the active fin 105 at a lower end of the source/drain region 150. The source/drain region 150 may be formed by partially recessing an upper portion of the active fin 105, but in some embodiments, the presence or absence of the recess and a depth of the recess may be variously changed. The source/drain regions 150 may have a maximum width Wsd greater than the second width W2 of the active fin 105 of the second region 105(R2). The maximum width Wsd may be larger, smaller, or substantially the same as the first width W1 and the width We of the channel layer. Since the source/drain regions 150 have the maximum width Wsd, resistance due to the source/drain regions may be reduced. In an example embodiment, the source/drain region 150 may have a merged shape connected to each other between the active fins 105 adjacent in the Y-direction, but the present disclosure is not limited thereto.

The source/drain regions 150 may be a semiconductor layer including silicon (Si), and may be formed of an epitaxial layer. The source/drain regions 150 may include different types of impurities and/or impurities having different concentrations. For example, the source/drain regions 150 may include n-type doped silicon (Si) or p-type doped silicon germanium (SiGe). In example embodiments, the source/drain regions 150 may include a plurality of regions including elements and/or doping elements having different concentrations.

The insulating liner 170 may be on, and/or at least partially cover, an upper surface of the device separation layer 110 not overlapping the gate structure 160, may extend over the source/drain regions 150, and may extend onto side surfaces of the gate structure 160. As used herein, when element A is said to "overlap" or is "overlapping" element B, it may refer to the situation where element A is said to extend over or past, and cover a part of, element B in a given direction. Note that element A may overlap element B in a first direction, but may or may not overlap element B in a second direction. The interlayer insulating layer 180 may be on the insulating liner 170. The insulating liner 170 may include, for example, at least one of silicon oxide, silicon nitride, and silicon oxynitride.

The interlayer insulating layer 180 may be on, and/or at least partially cover, upper surfaces of the source/drain regions 150 and the gate structures 160. The interlayer insulating layer 180 may be on an upper surface of the device separation layer 110 not covered by the gate structure 160. The interlayer insulating layer 180 may include, for example, at least one of silicon oxide, silicon nitride, and silicon oxynitride.

The contact structure 190 may extend through the insulating liner 170 and the interlayer insulating layer 180 between the gate structures 160 in a vertical direction, for example, the Z-direction. The contact structure 190 may be connected, such as being electrically connected, to the source/drain regions 150. The contact structure 190 may apply an electrical signal to the source/drain regions 150. The contact structure 190 may be on the source/drain regions 150. The contact structure 190 may have an inclined side surface in which a width of a lower portion is narrower than a width of an upper portion according to an aspect ratio, but the present disclosure is not limited thereto. The contact structure 190 may include a metal-semiconductor compound layer 192 and a contact plug 195 on the metal-semiconductor compound layer 192.

The metal-semiconductor compound layer 192 may include, for example, metal silicide, metal germanide, or metal silicide-germanide. In the metal-semiconductor compound layer 192, the metal may be titanium (Ti), nickel (Ni), tantalum (Ta), cobalt (Co), or tungsten (W), and the semiconductor may be silicon (Si), germanium (Ge) and silicon germanium (SiGe). For example, the metal-semiconductor compound layer 192 may include at least one of cobalt silicide (CoSi), titanium silicide (TiSi), nickel silicide (NiSi), and tungsten silicide (WSi).

The contact plug 195 may include a barrier layer and a plug layer. The barrier layer may surround a lower surface and side surfaces of the plug layer. The barrier layer may include a metal nitride, for example, at least one of titanium nitride (TiN), tantalum nitride (TaN), and tungsten nitride (WN). The plug layer may include a metal material, for example, at least one of, for example, aluminum (Al), copper (Cu), tungsten (W), cobalt (Co), ruthenium (Ru), or molybdenum (Mo). In some embodiments, the barrier layer may be omitted.

Figure 2:
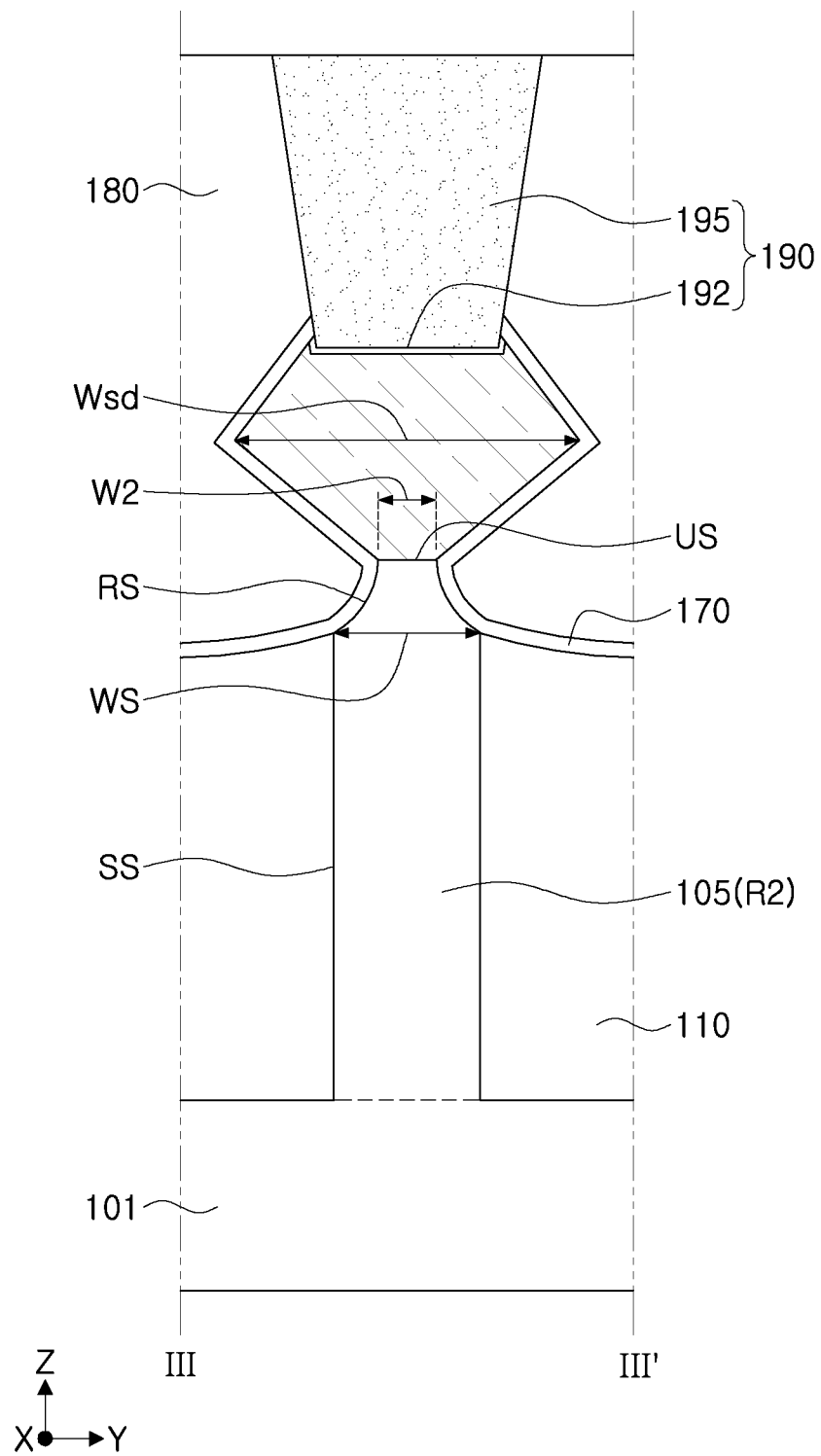
FIG. 2 is a partially enlarged view illustrating a region of a semiconductor device according to example embodiments.

FIG. 2 is a partially enlarged view illustrating a region of a semiconductor device according to example embodiments. Similar structures in FIG. 2 to those in FIGS. 1A and 1B may be referred to using the same or similar reference numerals, and the description of the same or similar structures previously described may be omitted here.

Referring to FIG. 2, the gate spacer layer 164 may not remain on the recessed side surface RS of the active fin 105 of the second region 105(R2). In this case, the insulating liner 170 may at least partially cover the device separation layer 110 and extend on the recessed side surface RS to be on, and/or at least partially cover, the source/drain regions 150.

Figure 3:
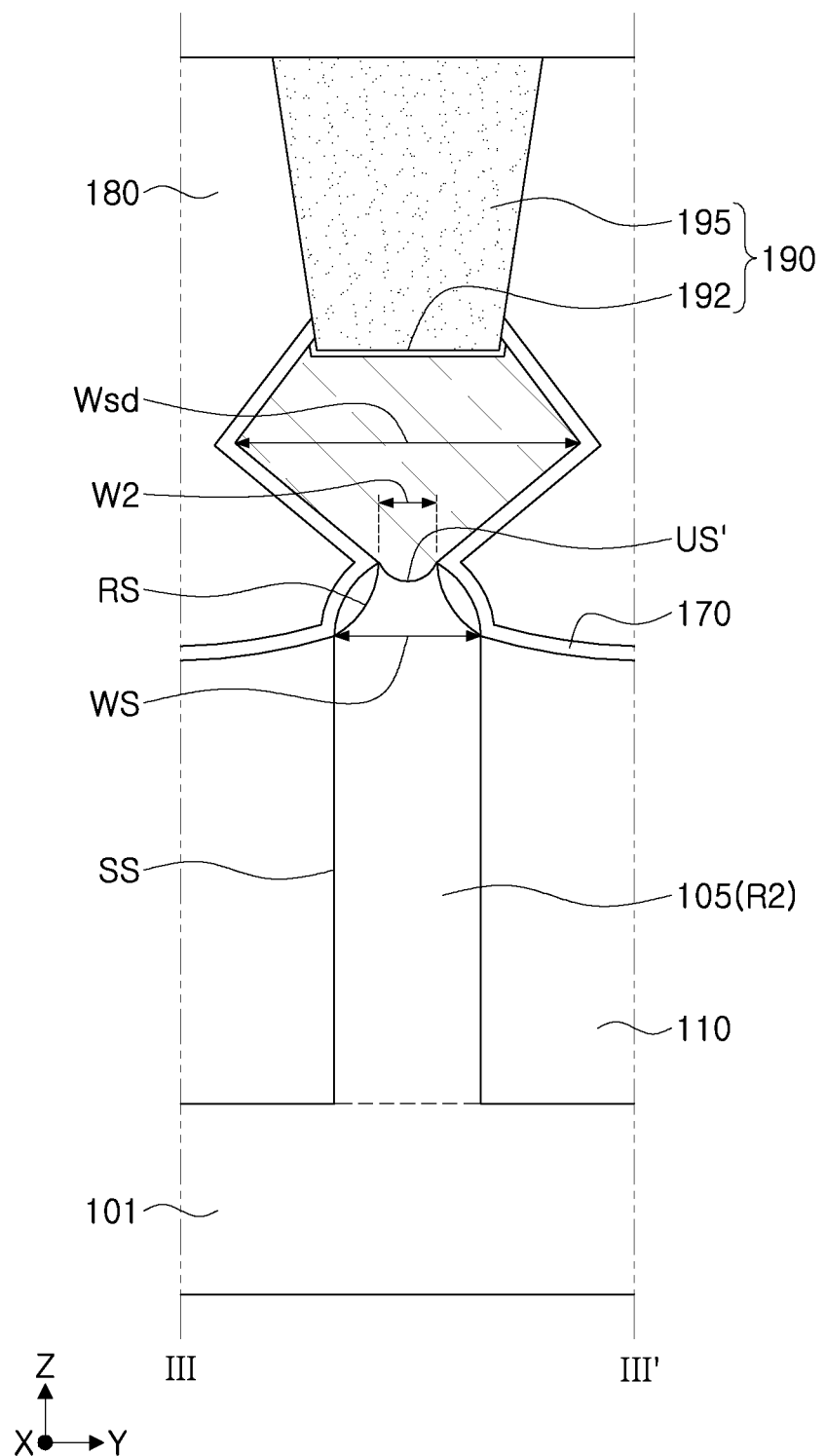
FIG. 3 is a partially enlarged view illustrating a region of a semiconductor device according to example embodiments.

FIG. 3 is a partially enlarged view illustrating a region of a semiconductor device according to example embodiments. Similar structures in FIG. 3 to those in previous Figures may be referred to using the same or similar reference numerals, and the description of the same or similar structures previously described may be omitted here.

Referring to FIG. 3, an upper surface US' of the active fin 105 of the second region 105(R2) has a second width W2 narrower than the first width W1, and the upper surface US' may have a downwardly concave shape. The concave upper surface US' may be formed in a process of recessing the active fin 105 (refer to EP2 of FIG. 10B) before an epitaxial growth process of the source/drain region 150.

Figure 4A:
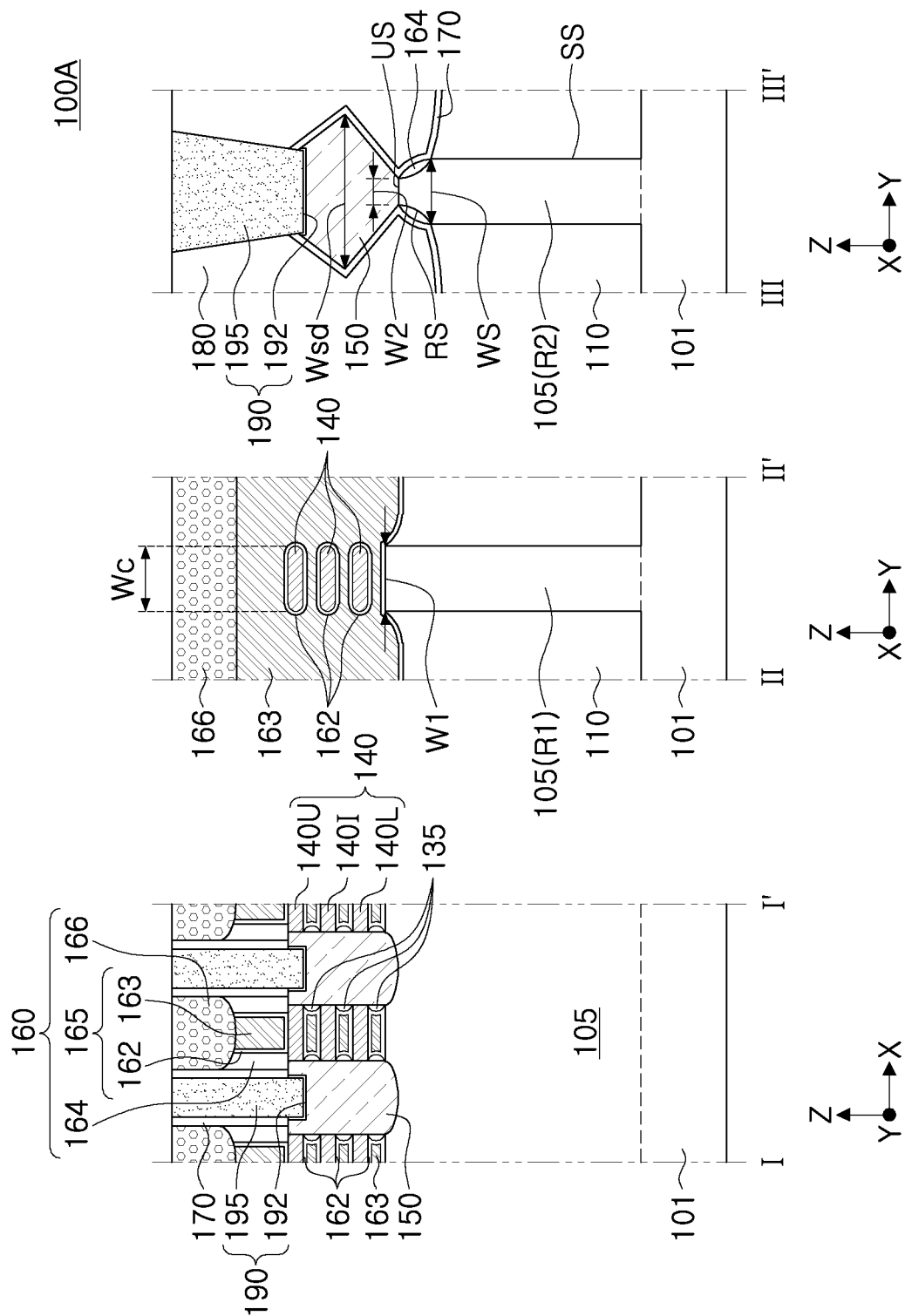
FIGS. 4A and 4B are cross-sectional views illustrating semiconductor devices according to example embodiments.

FIG. 4A is a cross-sectional view illustrating a semiconductor device according to example embodiments. Similar structures in FIG. 4A to those in previous Figures may be referred to using the same or similar reference numerals, and the description of the same or similar structures previously described may be omitted here.

Referring to FIG. 4A, a semiconductor device 100A may further include internal spacer layers 135. The internal spacer layers 135 may be between the channel layers 140 in parallel with the gate 165. The internal spacer layers 135 may have an outer surface that is substantially coplanar with an outer surface of each of the channel layers 140. Below the channel layers 140, the gate 165 may be spaced apart from the source/drain regions 150 due to the internal spacer layers 135. The internal spacer layers 135 may have a shape in which a side surface facing the gate 165 is convexly rounded inwardly toward the gate 165, but the present disclosure is not limited thereto. The internal spacer layers 135 may be formed of silicon oxide, silicon nitride, and silicon oxynitride.

Figure 4B:
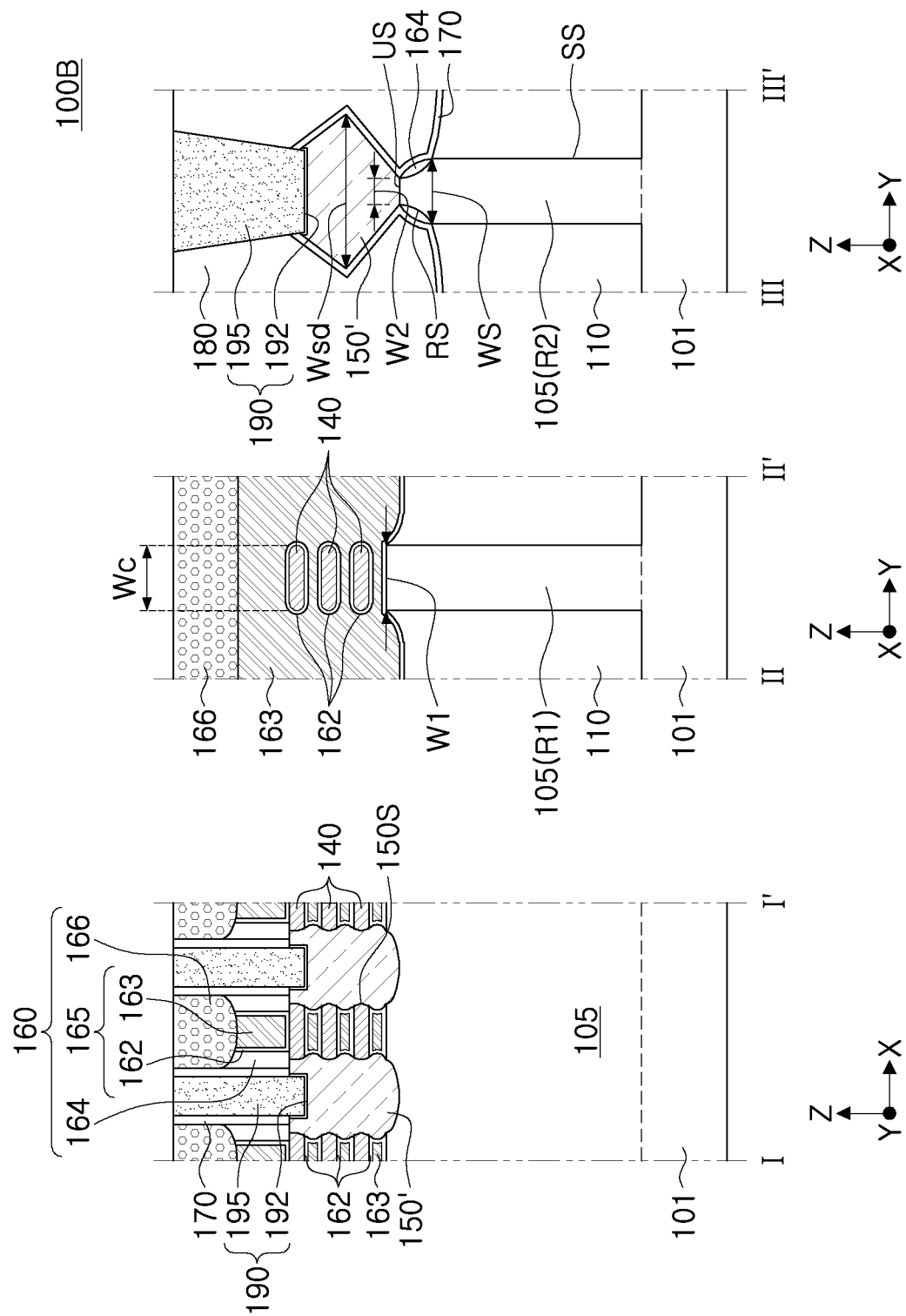

FIG. 4B is a cross-sectional view illustrating a semiconductor device according to example embodiments. Similar structures in FIG. 4B to those in previous Figures may be referred to using the same or similar reference numerals, and the description of the same or similar structures previously described may be omitted here.

Referring to FIG. 4B, a portion of the gate 165 between the channel layers 140, and between the channel layer 140 and the active fin 105 of a semiconductor device 100B, may have a recessed side surface. The source/drain regions 150' may contact a portion of the gate 165 having a recessed side surface, and side surfaces 150S of the source/drain regions 150' may have a wavy shape.

Figure 5:
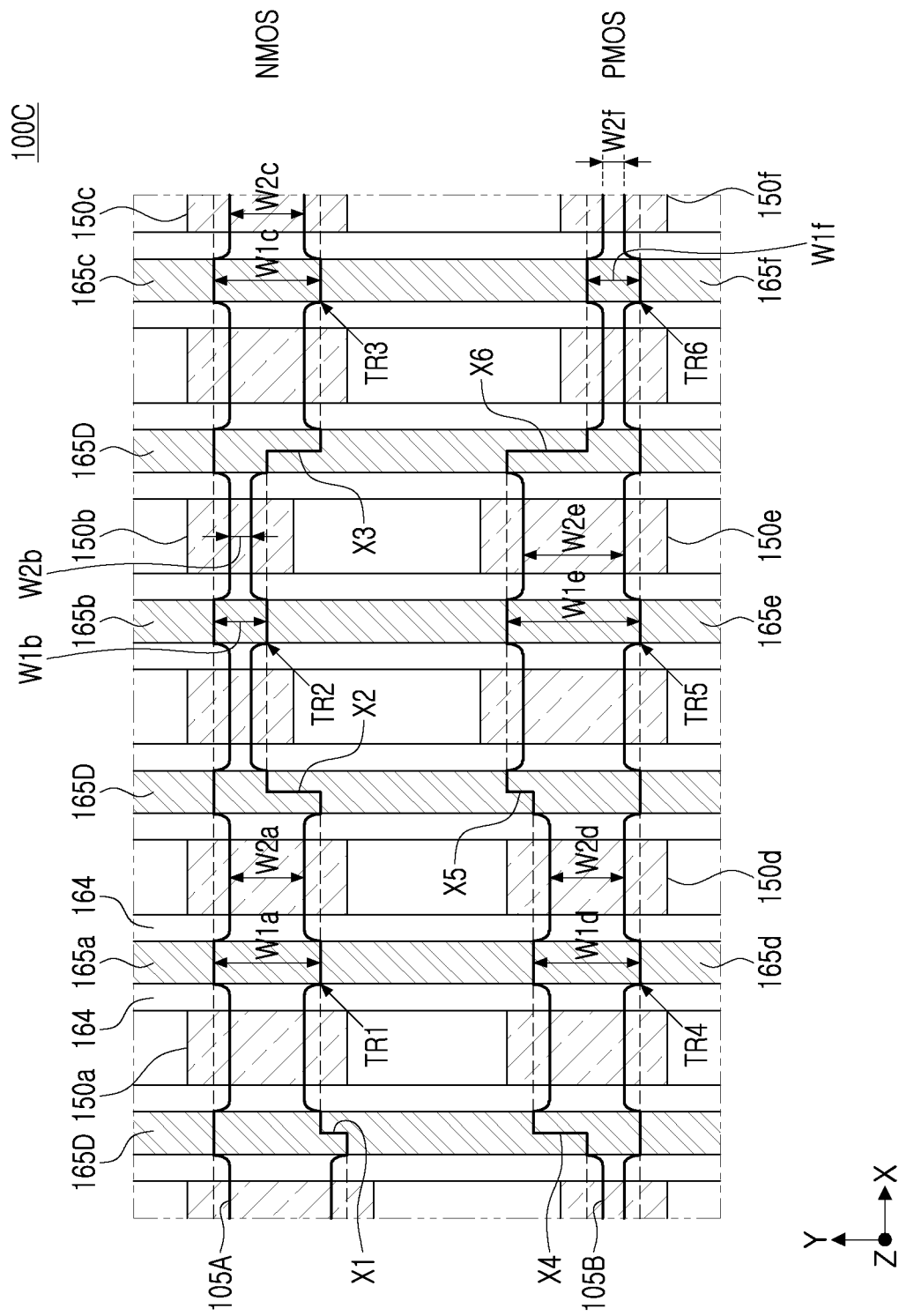
FIG. 5 is a plan view illustrating a semiconductor device according to example embodiments.

FIG. 5 is a plan view illustrating a semiconductor device according to example embodiments. Similar structures in FIG. 5 to those in previous Figures may be referred to using the same or similar reference numerals, and the description of the same or similar structures previously described may be omitted here.

Referring to FIG. 5, a substrate 101 (not shown in FIG. 5) of a semiconductor device 100C may have an NMOS region and a PMOS region, and the semiconductor device 100C may include one or more first active fins 105A and a second active fin 105B parallel to the one or more first active fins 105A in the Y-direction. The semiconductor device 100C may include transistors (e.g., TR1, TR2, and TR3) providing different channel widths in the NMOS region and transistors (e.g., TR4, TR5, TR6) providing different channel widths in the PMOS region PMOS. In order to provide transistors having different channel widths, the patterns of the active fin(s) may provide transition regions (e.g., X1, X2, X3, X4, X5, X6) in which a width in the Y-direction in a specific region is changed. The structure intersecting the transition regions of the patterns of the active fin may be a dummy gate 165D that does not substantially function in a semiconductor device, but the present disclosure is not limited thereto. The first transistor TR1 and the fourth transistor TR4 may share a first gate electrode 165a and may have substantially the same channel width. The second transistor TR2 and the fifth transistor TR5 may share a second gate electrode 165b, and a channel width of the fifth transistor TR5 of the PMOS region PMOS may be greater than a channel width of the second transistor TR2 of the NMOS region NMOS. The third transistor TR3 and the sixth transistor TR6 may share a third gate electrode 165c, and a channel width of the sixth transistor TR6 of the PMOS region PMOS may be smaller than a channel width of the third transistor of the NMOS region NMOS. However, this is only an example, and transistors having various structures may be provided according to electrical characteristics required in a semiconductor device.

Meanwhile, in the first transistor TR1 of the semiconductor device 100C, a first width W1a in the Y-direction of the first active fin 105A intersecting the first gate 165a may be wider than a second width W2a in the Y-direction of the first active fin 105A overlapping the first source/drain regions 150a on both sides of the first gate 165a of the first transistor TR1. Similarly, in the second transistor TR2, a first width W1b in the Y-direction of the first active fin 105A intersecting the second gate 165b may be wider than a second width W2b in the Y-direction of the first active fin 105A overlapping the second source/drain regions 150b on both sides of the second gate 165b of the second transistor TR2. Similarly, in the third transistor TR3, a first width W1c in the Y-direction of the first active fin 105A intersecting the third gate 165c may be wider than a second width W2c in the Y-direction of the first active fin 105A overlapping the third source/drain regions 150c on both sides of the third gate 165c of the third transistor TR3. Similarly, in regions of the fourth to sixth transistors TR4, TR5, and TR6 overlapping the gates 165d, 165e, and 165f, respectively, a width of the second active fin 105B in the Y-direction (W1d, W1e, and W1f, respectively) may be wider than a width of the second active fin 105B (W2d, W2e, and W2f, respectively) in a region below the source/drain regions 150d, 150e, and 150f. According to an embodiment of the present disclosure, in a low-voltage transistor, a width of the channel region that plays a dominant role in the total resistance may be increased, and accordingly, resistance due to the channel may be relatively reduced, so that the electrical characteristics may be improved.

Figure 6:
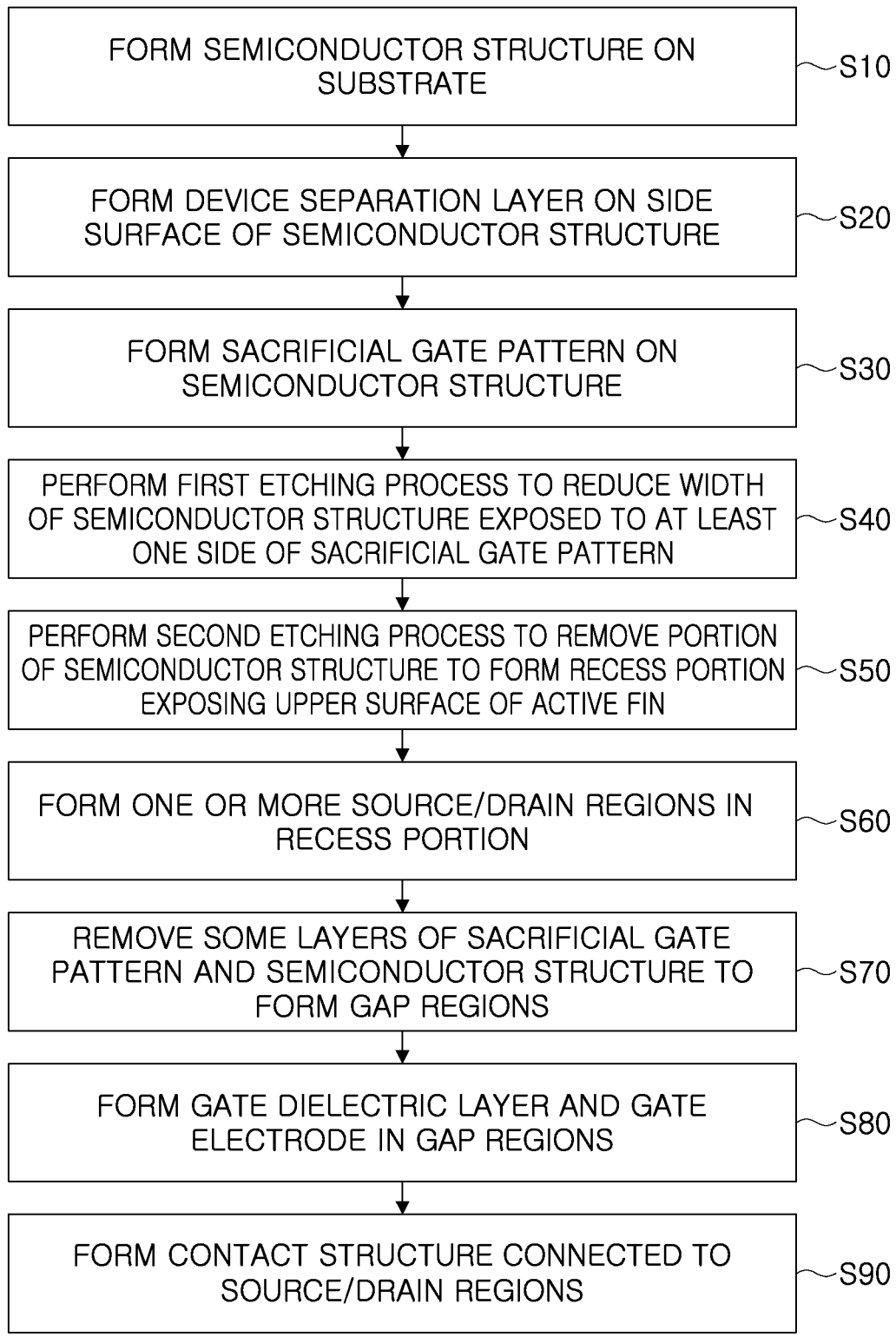
FIG. 6 is a flowchart illustrating a method of manufacturing a semiconductor device according to example embodiments.

FIG. 6 is a flowchart illustrating a sequential process of a method of manufacturing a semiconductor device according to an example embodiment.

FIGS. 7A to 12 are diagrams illustrating a sequential process of a method of manufacturing a semiconductor device according to example embodiments.

Figure 7A:
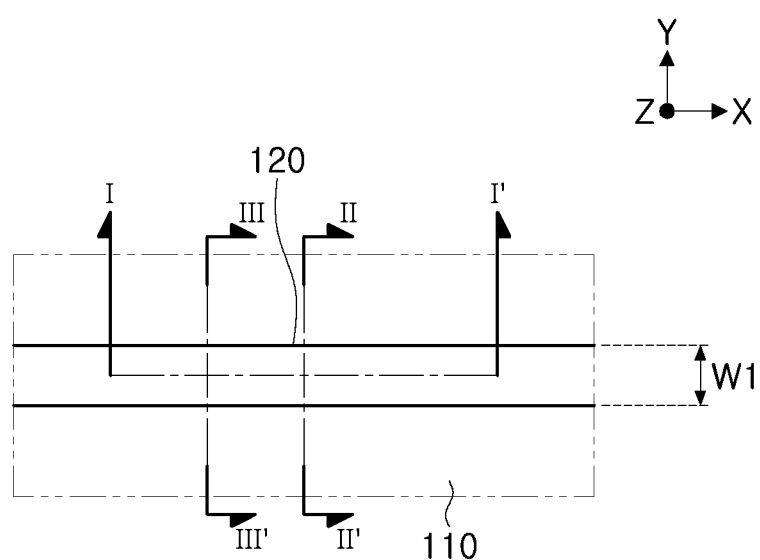
FIGS. 7A to 12 are diagrams illustrating a sequential process of a method of manufacturing a semiconductor device according to example embodiments.
Figure 7B:
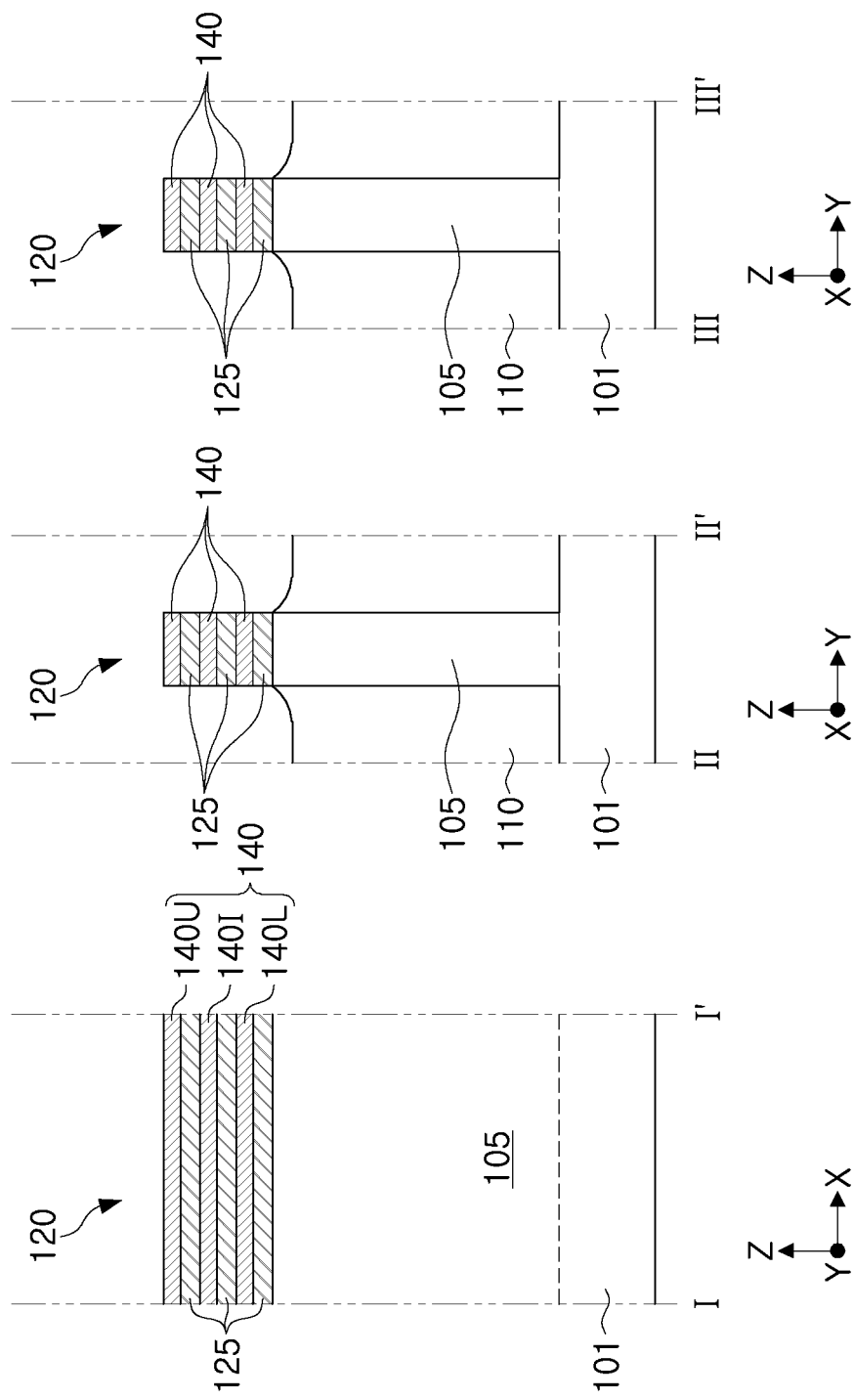

Referring to FIGS. 6, 7A, and 7B, a semiconductor structure 120 may be formed on the substrate 101 (S10), and a device separation layer 110 may be formed on at least one side surface of the semiconductor structure 120 (S20).

First, to form the semiconductor structure 120, in one embodiment, first layers 125 as 'sacrificial layers' and second layers 140 as 'channel layers' may be alternately stacked on the substrate 101. The semiconductor structure 120 may be formed by removing a portion of the substrate 101 and a stack structure of the first layers 125 and the second layers 140. The first layers 125 may be layers replaced with the gate 165 through a subsequent process as shown in FIG. 1B. The first layers 125 may be between the substrate 101 and a lower one of the second layers 140 (140L), between the lower one of the second layers 140 (140L) and an intermediate one of the second layers 140 (140I), and between the intermediate one of the second layers 140 (140I) and an upper one of the second layers 140 (140U). The first layers 125 may be formed of a material having etch selectivity with respect to the second layers 140. The second layers 140 and the first layers 125 may include different materials. The first layers 125 and the second layers 140 may include, for example, a semiconductor material including at least one of silicon (Si), silicon germanium (SiGe), and germanium (Ge), but may include materials different from each other, and may or may not include impurities. For example, the first layers 125 may include silicon germanium (SiGe), and the second layers 140 may include silicon (Si). The first layers 125 and the second layers 140 may be formed by performing an epitaxial growth process using the substrate 101 as a seed.

The semiconductor structure 120 may include sacrificial layers 125 and preliminary channel layers 140 formed by patterning the first and second layers 125 and 140 that are alternately stacked on each other, and may further include the active fin 105 formed to extend from an upper surface of the substrate 101 as a portion of the substrate 101 is removed. The semiconductor structure 120 may be formed in the form of a line extending in one direction, for example, the X-direction. The semiconductor structure 120 may be formed to have a plurality of regions having different widths in the Y-direction. For example, the semiconductor structure 120 may include a region in which a side surface is inclined or bent in a plane to provide a first transistor including a narrow channel and a second transistor including a wide channel, as seen in FIG. 5.

The device separation layer 110 may be formed in a region from which a portion of the substrate 101 is removed by embedding an insulating material and then recessing the active fin 105 to protrude. The device separation layer 110 may be on, and/or cover, a portion of side surfaces of the semiconductor structure 120. The upper surface of the device separation layer 110 may be formed to be lower than the upper surface of the active fin 105. The upper surface of the device separation layer 110 may be formed to have a curved upper surface having a higher level toward the active fin 105 of the substrate 101.

Figure 8A:
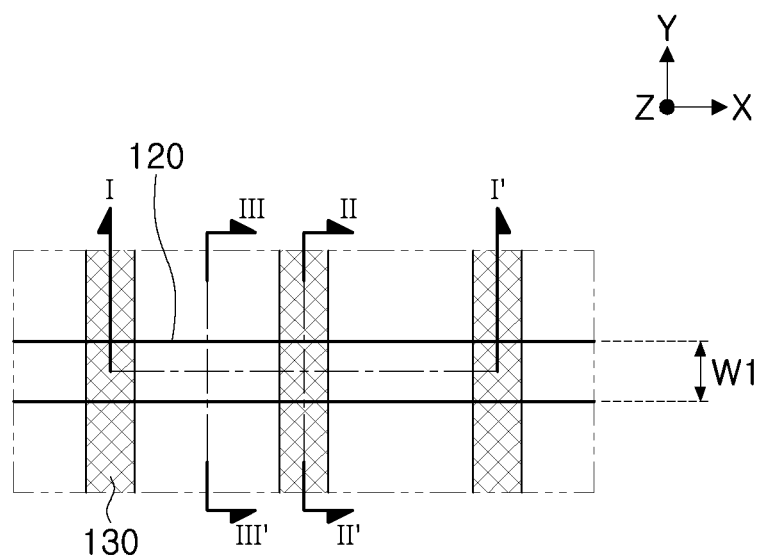
Figure 8B:
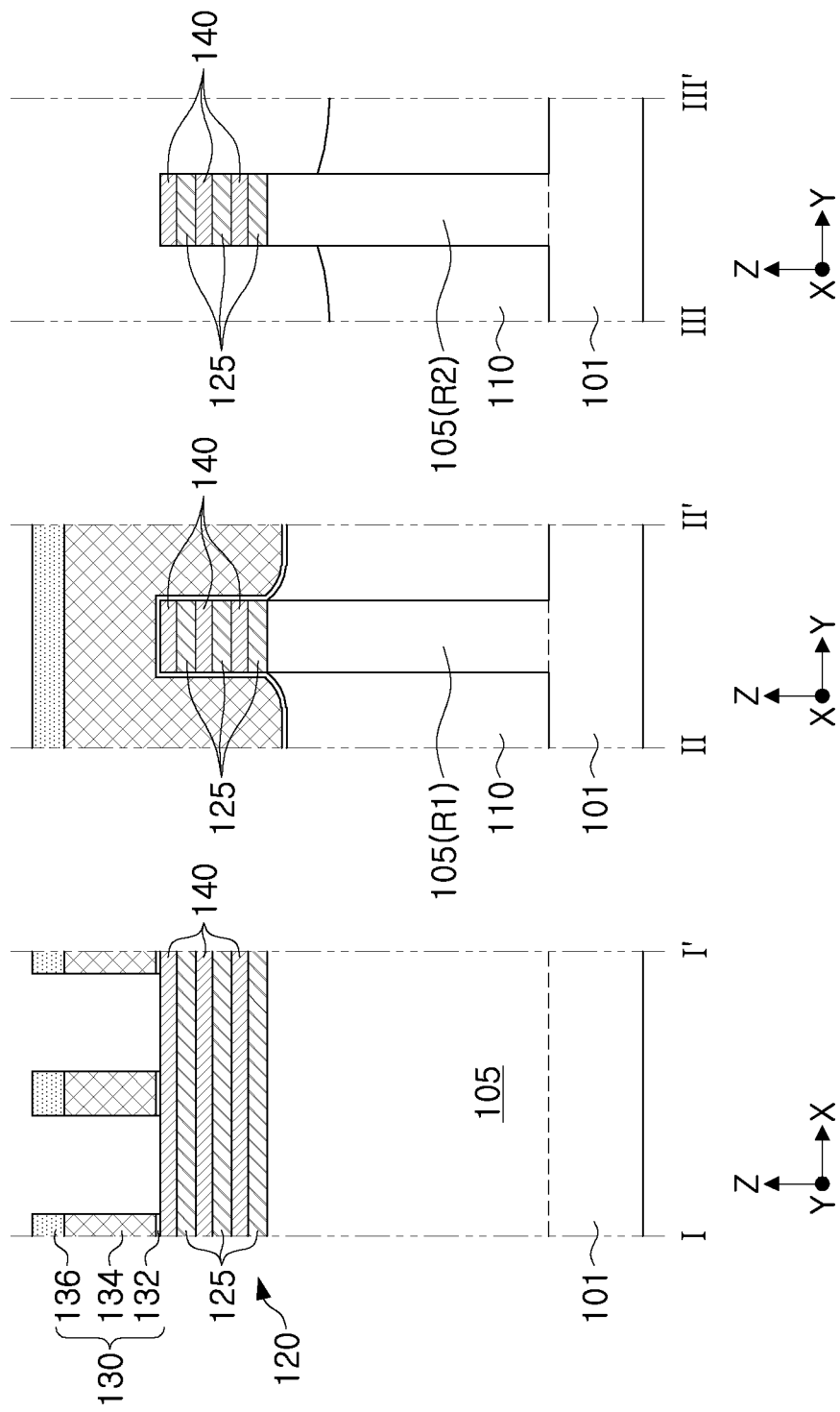

Referring to FIGS. 6, 8A, and 8B, a sacrificial gate pattern 130 may be formed on the semiconductor structure 120 (S30).

The sacrificial gate pattern 130 may be a sacrificial structure formed in a region in which the gate dielectric layer 162 and the gate electrode 163 are on the channel layers 140 through a subsequent process, as shown in FIG. 1B. The sacrificial gate pattern 130 may intersect the first region of the semiconductor structure 120 and extend in the Y-direction. The active fin 105 may include a first region 105(R1) overlapping the sacrificial gate pattern 130 and a second region 105(R2) not overlapping the sacrificial gate pattern 130. The sacrificial gate pattern 130 may include first and second sacrificial gate layers 132 and 134 and a mask pattern layer 136 that are sequentially stacked. The first and second sacrificial gate layers 132 and 134 may be patterned using a mask pattern layer 136. The first and second sacrificial gate layers 132 and 134 may be an insulating layer and a conductive layer, respectively, but are not limited thereto, and the first and second sacrificial gate layers 132 and 134 may be formed as a single layer. In one embodiment, the first sacrificial gate layer 132 may include silicon oxide, and the second sacrificial gate layer 134 may include polysilicon. The mask pattern layer 136 may include silicon oxide and/or silicon nitride. While forming the sacrificial gate pattern 130, a height of an upper end of the device separation layer 110 adjacent to the active fin 105 of the second region 105(R2) may be partially lowered.

Figure 9A:
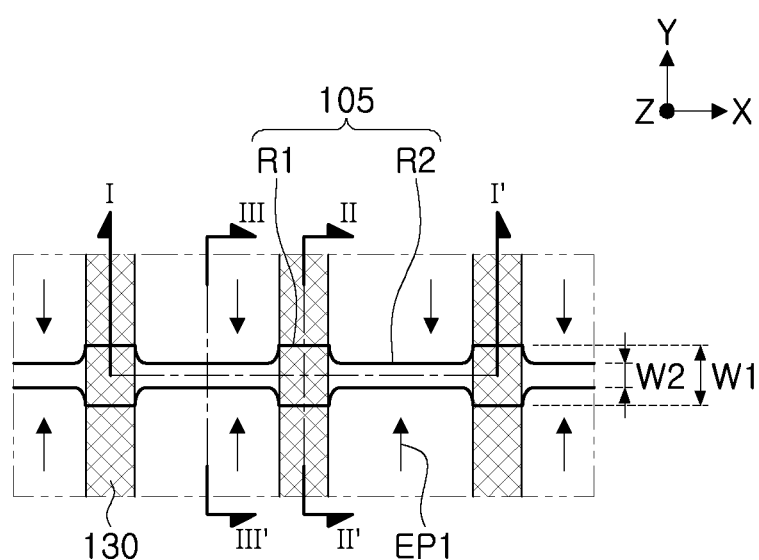
Figure 9B:
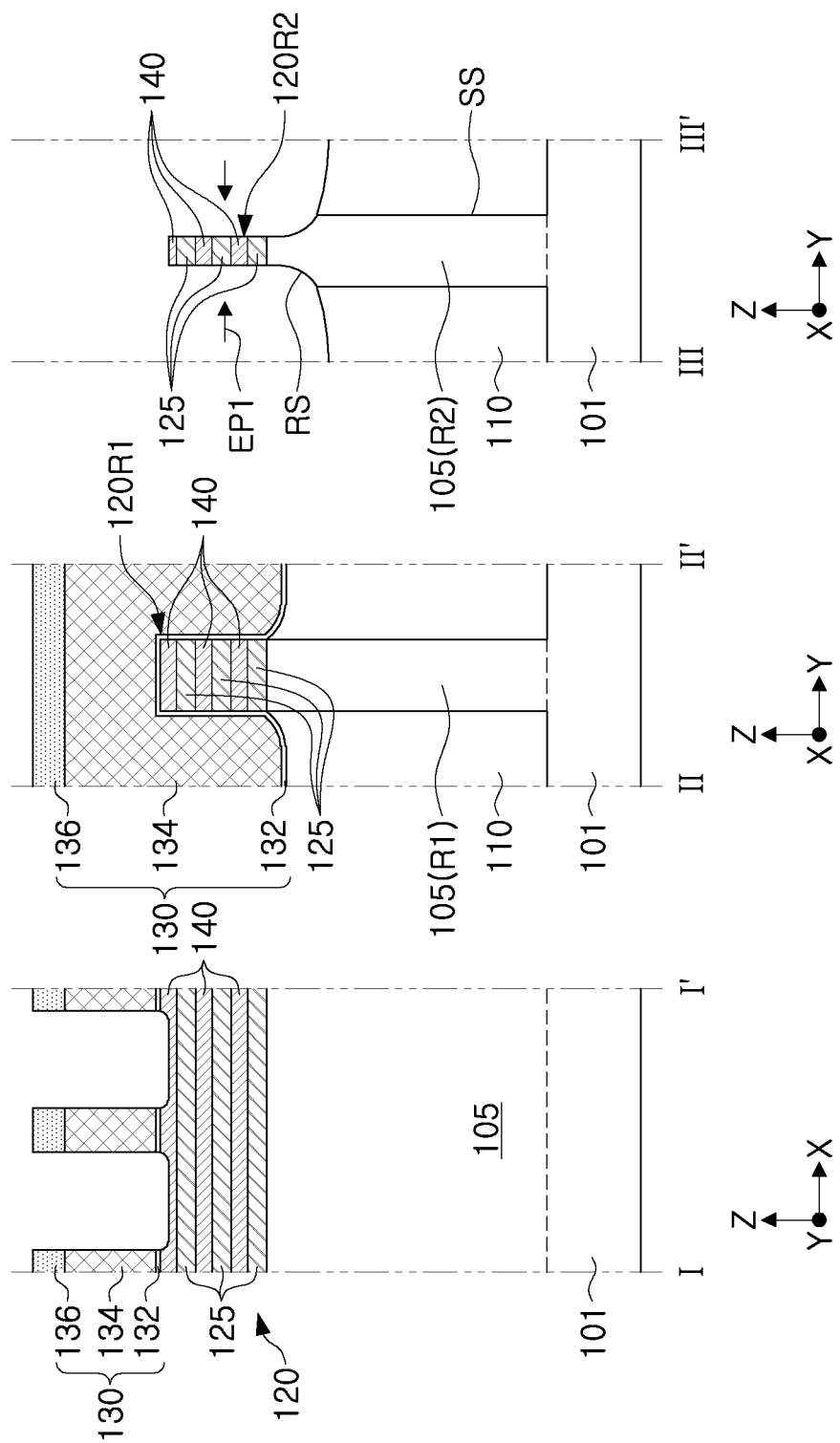

Referring to FIGS. 6, 9A, and 9B, a first etching process EP1 for reducing the width of the semiconductor structure 120 exposed to at least one side of the sacrificial gate pattern 130 in the Y-direction may be performed. (S40).

By performing the first etching process EP1, the width of the second region 120R2 of the semiconductor structure 120 in the Y-direction may be reduced. In this case, the second region 120R2 of the semiconductor structure 120 may be partially recessed from the top between the sacrificial gate patterns 130 so that a height in the Z-direction may also be reduced. As shown in FIG. 9A, the semiconductor structure 120 may have a portion having a width decreasing in the Y-direction in a direction away from the side surface of the sacrificial gate pattern 130. As illustrated in FIG. 9B, an upper side surface of the active fin 105 of the second region 105(R2) may be recessed, and portions of side surfaces of the sacrificial layers 125 and the preliminary channel layers 140 stacked thereon may also be recessed. A first width of the sacrificial layers 125 and the preliminary channel layers 140 stacked on the second region 105(R2) in the Y-direction may be different from a second width of the sacrificial layers 125 and the preliminary channel layers 140 stacked on the first region 105(R1) in the Y-direction. The first width may be narrower than the second width (see the second region 120R2 of the semiconductor structure 120 as compared to the first region 120R1 of the semiconductor structure 120).

Meanwhile, a slope of an upper side surface RS of the active fin 105 of the second region 105(R2) may be made different from a slope of a side surface SS by the first etching process EP1. For example, the active fin 105 of the second region 105(R2) may include a first portion in contact with the device separation layer 110 and a second portion extending from the first portion and protruding above the device separation layer 110, and the slope of the side surface RS of the second portion may be different from the slope of the side surface SS of the first portion. For example, the side surface SS of the first portion may form a first angle with respect to the upper surface of the substrate 101, and the side surface RS of the second portion may form a second angle different from the first angle with respect to an upper surface of the substrate 101. The first angle may be steeper than the second angle.

Figure 10A:
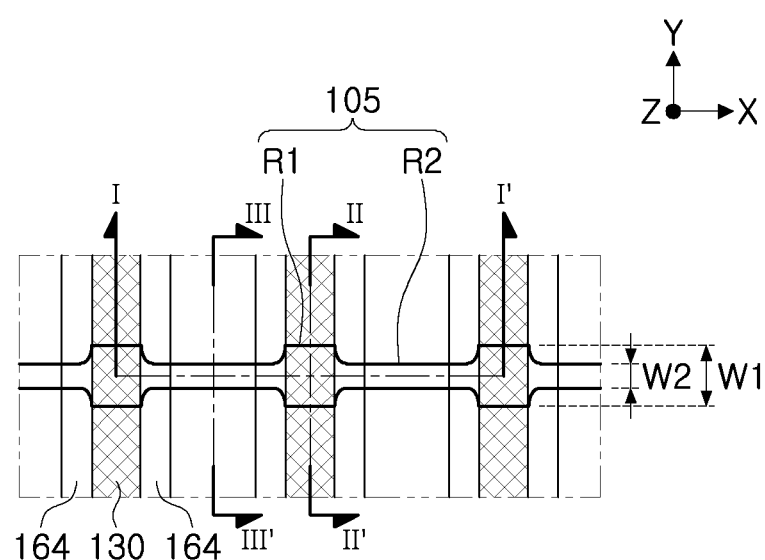
Figure 10B:
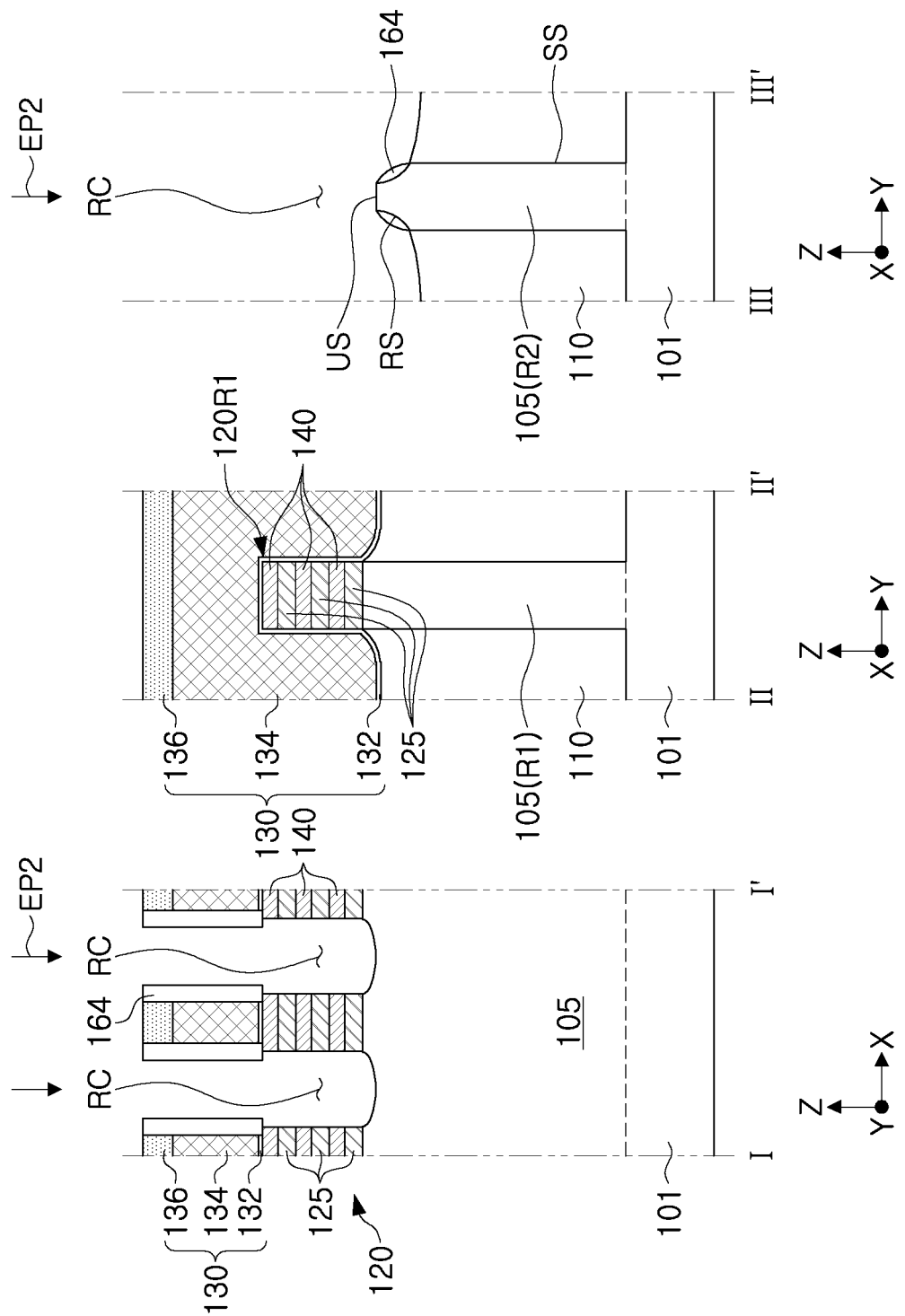

Referring to FIGS. 6, 10A, and 10B, a second etching process EP2 may be formed to form one or more recess portions RC exposing an upper surface of the active fin 105 by forming gate spacer layers 164 and removing a portion of the semiconductor structure 120 (S50).

The gate spacer layers 164 may be formed by forming a film having a uniform thickness on upper and side surfaces of the semiconductor structure 120 and upper and side surfaces of the sacrificial gate pattern 130 and then performing anisotropic etching. The gate spacer layers 164 may be formed of a low-k material, and may include at least one of, for example, SiO, SiN, SiCN, SiOC, SiON, and SiOCN. Some of the gate spacer layers 164 may remain on the recessed side surface RS of the active fin 105 of the second region 105(R2).

The second etching process EP2 may be to partially remove the exposed semiconductor structure 120 using the sacrificial gate structure including the sacrificial gate pattern 130 and the gate spacer layers 164 as a mask. As the second region 120R2 of the semiconductor structure 120 is removed, one or more recess portions RC in which an upper surface of the second region 105(R2) of the active fin 105 is exposed may be formed. Accordingly, the preliminary channel layers 140 have a limited length in the X-direction and form the channel layers 140 of FIG. 1B.

In an example embodiment, the sacrificial layers 125 exposed by a recess portion RC may be partially removed from the side surface, and internal spacer layers 135 (as seen in FIG. 4A) may be formed in the region from which the sacrificial layers 125 are removed. The internal spacer layers 135 may be formed by partially or completely filling the region from which the sacrificial layers 125 are partially removed with an insulating material and then removing the insulating material deposited on the outside of the channel layers 140. The internal spacer layers 135 may be formed of the same material as that of the gate spacer layers 164, but are not limited thereto. For example, the internal spacer layers 135 may include at least one of SiN, SiCN, SiOCN, SiBCN, and SiBN. However, in some embodiments, the process of forming the internal spacer layers 135 may be omitted.

Figure 11A:
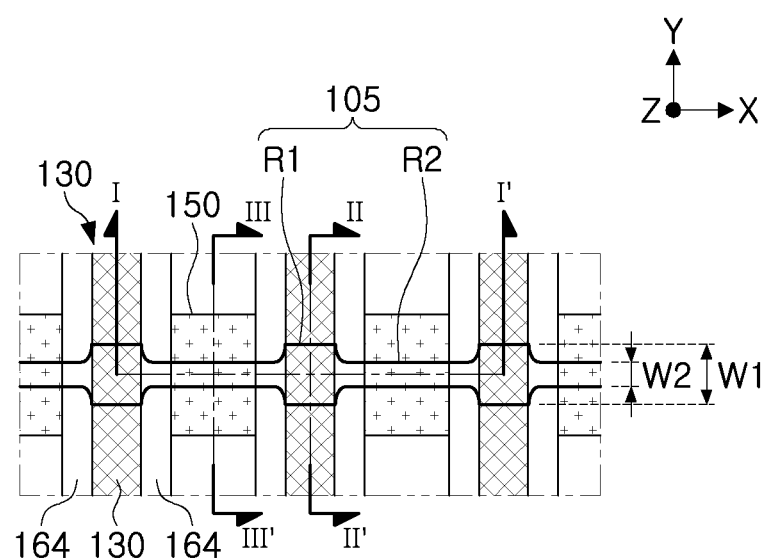
Figure 11B:
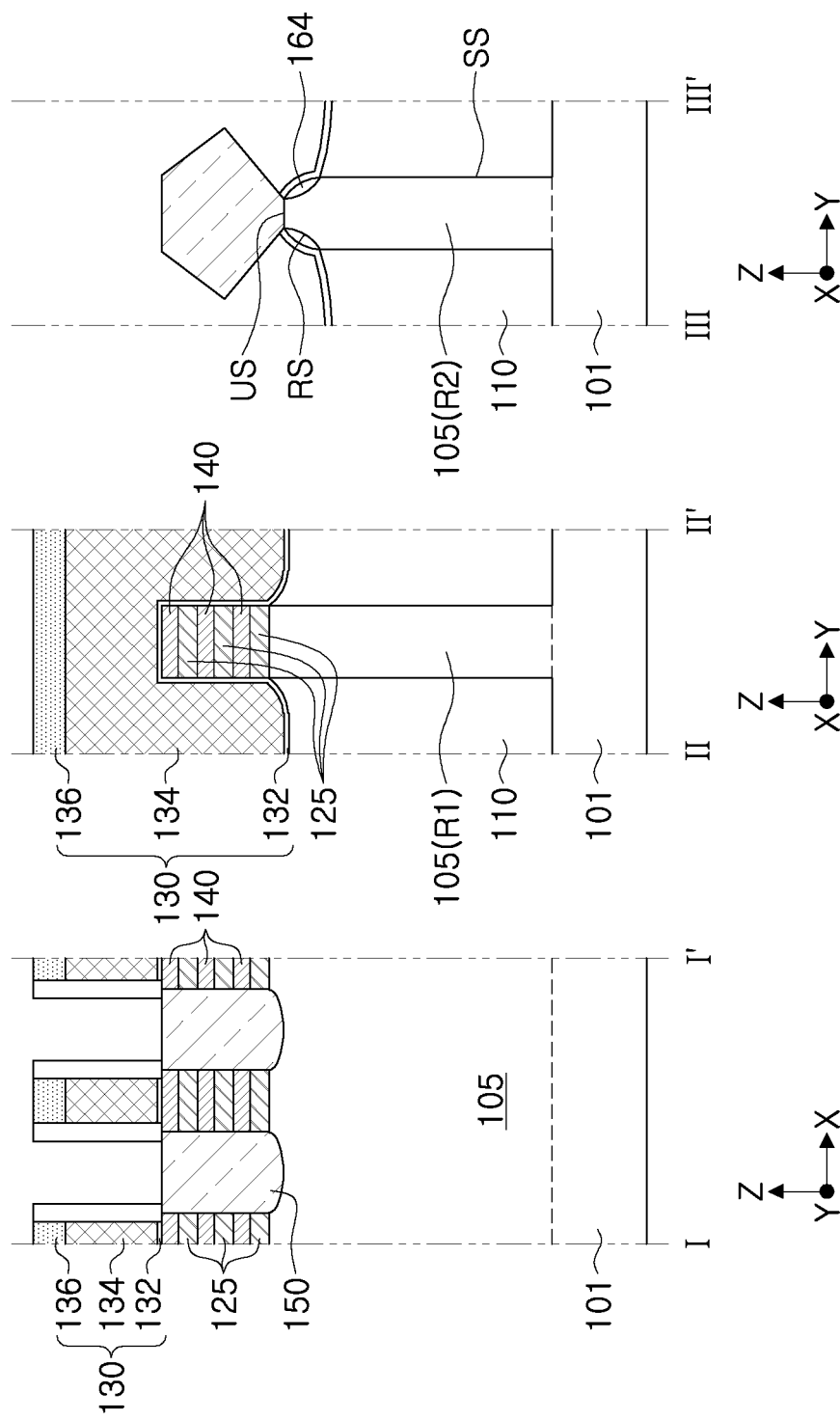

Referring to FIGS. 6, 11A, and 11B, one or more source/drain regions 150 may be formed in the recess portions RC (S60).

The source/drain regions 150 may be formed by performing an epitaxial growth process in each of the recess portions RC. The source/drain regions 150 may be connected to the channel layers 140 through side surfaces. Upper surfaces of the source/drain regions 150 may be on substantially the same level as the upper surface of the upper channel layer 140, but are not limited thereto, and may be disposed on a higher level. In some embodiments, "level" may mean a height level when viewed with respect to a reference plane, such as an upper surface of the substrate 101. When an Element A is said to be at a "higher level" than Element B, this may mean that Element A is a height level that is further away from an upper surface of the substrate 101 than the height level of Element B. When an Element A is said to be at a "lower level" than Element B, this may mean that Element A is a height level that is closer to an upper surface of the substrate 101 than the height level of Element B. The source/drain regions 150 may include impurities by in-situ doping, and may include a plurality of layers having different doping elements and/or doping concentrations.

Figure 12:
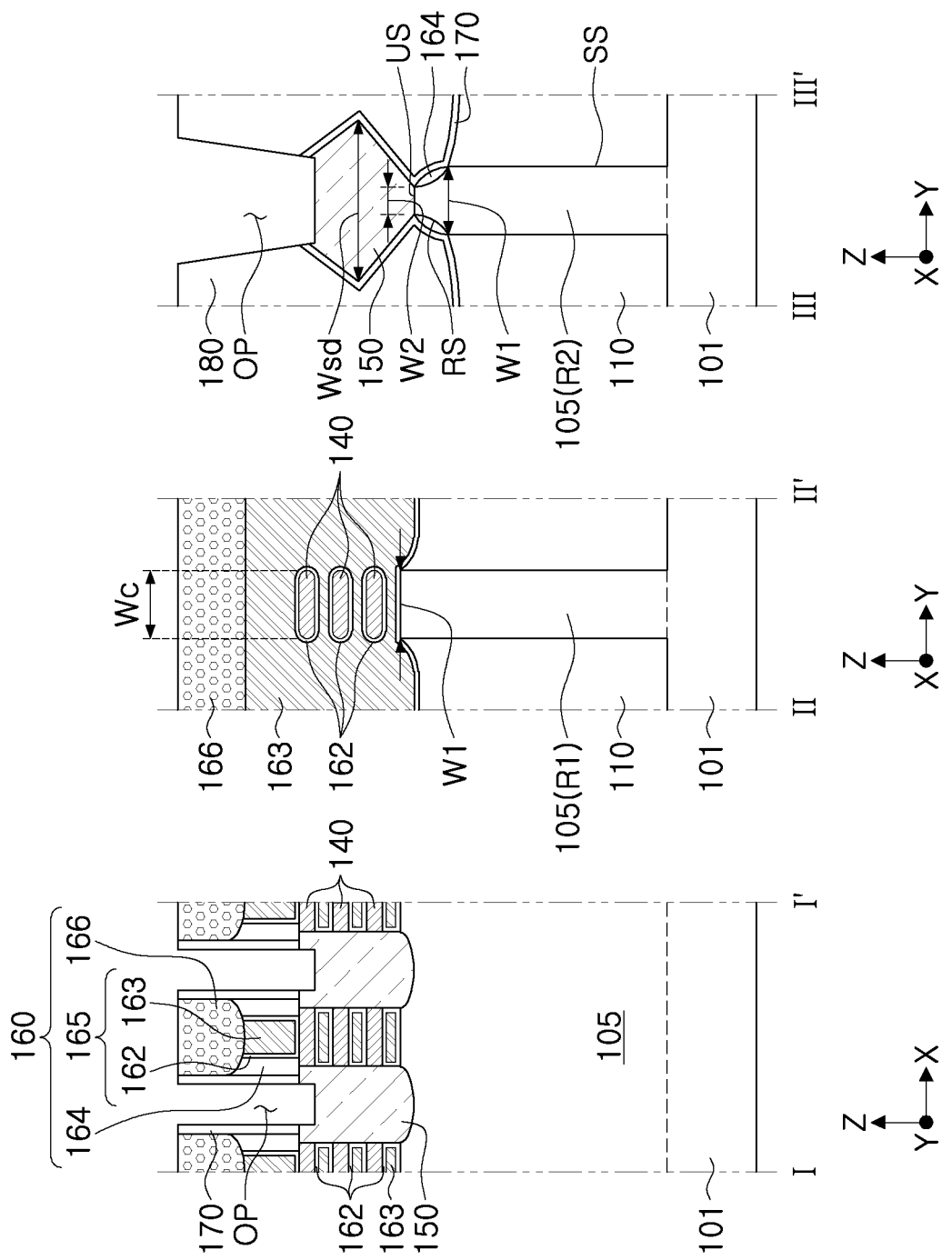

Referring to FIGS. 6 and 12, some layers of the sacrificial gate pattern 130 and some layers 125 of the semiconductor structure 120 may be removed to form gap regions (S70), the gate dielectric layer 162 and the gate electrode 163 may be formed in the gap regions (S80), and a contact structure 190 connected to the source/drain region 150 may be formed (S90).

First, the insulating liner 170 and the interlayer insulating layer 180 may be formed. An insulating film may be formed on the sacrificial gate structures and the source/drain regions 150 and a planarization process may be performed so that an upper surface of the mask pattern layer 136 (See FIG. 8B) may be exposed, thereby forming the insulating liner 170 and the interlayer insulating layer 180.

Next, the first and second sacrificial gate layers 132 and 134, the mask pattern layer 136, and the sacrificial layers 125 may be selectively removed with respect to the spacer layers 164, the insulating liner 170, the interlayer insulating layer 180, and the channel layers 140. The first and second sacrificial gate layers 132 and 134 and the mask pattern layer 136 may be removed to form upper gap regions, and the exposed sacrificial layers 125 may be removed through the upper gap regions to form lower gap regions.

Next, the gate dielectric layer 162 may be formed in the lower gap regions and the upper gap regions. After the gate electrode 163 is formed so that the lower gap regions and the upper gap regions are completely embedded, the gate electrode 163 may be removed from an upper portion to have a predetermined depth in the upper gap regions. In the upper gap regions, as shown in FIG. 1B, after the gate 165 and the gate spacer layers 164 are removed from the upper portion to have a predetermined depth, the gate capping layer 166 may be formed. Accordingly, the gate structure 160 including the gate 165, the gate spacer layer 164, and the gate capping layer 166 may be formed.

Next, an opening OP exposing the source/drain regions 150 through the interlayer insulating layer 180 and the insulating liner 170 may be formed, and a conductive material may be deposited in the opening OP to form the contact structure 190, as seen in FIG. 1B.

By forming the width of the active fin overlapping the gate and the channel layer to be greater than the width of the active fin overlapping the source/drain regions, channel resistance may be lowered, thereby providing a semiconductor device having improved electrical characteristics and reliability, and a manufacturing method thereof may be provided.

The various and beneficial advantages and effects of the present disclosure are not limited to the above, and will be more easily understood in the course of describing specific embodiments of the present disclosure.

While example embodiments have been shown and described above, it will be apparent to those skilled in the art that modifications and variations could be made without departing from the scope of the present disclosure as defined by the appended claims.

What is claimed is:

1. A method of manufacturing a semiconductor device, the method comprising:
    forming a semiconductor structure extending from a substrate in a first direction and having a first region and a second region;
    forming a sacrificial gate pattern intersecting the first region of the semiconductor structure and extending in a second direction perpendicular to the first direction;
    reducing a width in the second direction of the second region of the semiconductor structure exposed to at least one side of the sacrificial gate pattern;
    forming at least one recess portion by removing a portion of the second region of the semiconductor structure;
    forming one or more source/drain regions in the at least one recess portion of the semiconductor structure on the at least one side of the sacrificial gate pattern;
    forming at least one gap region by removing the sacrificial gate pattern; and
    forming a gate structure by depositing a gate dielectric layer and a gate electrode in the at least one gap region,
    wherein the semiconductor structure includes an active fin extending from the substrate in the first direction in the first region and the second region,
    wherein the one or more source/drain regions is on the active fin of the second region,
    wherein an upper surface of the active fin of the first region has a first width in the second direction,
    wherein, in a cross-section along a third direction that is perpendicular to the first direction and the second direction, the active fin of the second region includes an upper portion having a second width in the second direction and a lower portion having a third width in the second direction,
    wherein the at least one recess portion is between the upper portion and the lower portion of the active fin of the second region in the third direction,
    wherein the second width is different from the first width, and
    wherein the second width is different from the third width.

2. The method of claim 1,
    wherein the reducing the width in the second direction of the second region of the semiconductor structure comprises recessing at least a portion of an upper side surface of the active fin of the second region to have the second width that is less than the first width and is less than the third width in the second direction.

3. The method of claim 2, wherein:
    the first width is a minimum width of the active fin of the first region in the second direction, and
    the second width is a minimum width of the active fin of the second region in the second direction.

4. The method of claim 2, further comprising forming a device separation layer on portions of side surfaces of the semiconductor structure,
    wherein the lower portion of the active fin of the second region is in contact with the device separation layer, and
    wherein the upper portion of the active fin of the second region extends from the lower portion and protrudes above the device separation layer.

5. The method of claim 4, wherein the reducing the width in the second direction of the second region of the semiconductor structure comprises recessing a side surface of the upper portion to have a slope different from a slope of a side surface of the lower portion.

6. The method of claim 2, wherein:
    the forming the semiconductor structure further comprises alternately stacking sacrificial layers and preliminary channel layers on the active fin, and
    wherein a width in the second direction of the preliminary channel layers of the first region overlapping the sacrificial gate pattern is different from a width in the second direction of the preliminary channel layers of the second region.

7. The method of claim 2, wherein:
    the forming the semiconductor structure further comprises alternately stacking sacrificial layers and preliminary channel layers on the active fin, the forming the at least one recess portion further comprises forming the preliminary channel layers as channel layers, and the forming the at least one gap region comprises selectively removing the sacrificial layers of the semiconductor structure with respect to the channel layers.

8. The method of claim 1, further comprising:

forming gate spacer layers on both side surfaces of the sacrificial gate pattern, wherein some of the gate spacer layers remain on a side surface of a portion of the second region of the semiconductor structure having a reduced width in the second direction.

9. The method of claim 2, wherein at least one of the one or more source/drain regions contacts a portion of the gate structure having a recessed side surface and has a maximum width in the second direction greater than a width of the active fin of the second region in the second direction, and at least one side surface of the one or more source/drain regions has a wavy shape.

10. A method of manufacturing a semiconductor device, the method comprising:

alternately stacking first layers and second layers on a substrate to form a stack structure;

forming an active fin extending from the substrate in a first direction and a semiconductor structure comprising sacrificial layers and preliminary channel layers formed as the first layers and the second layers are patterned by etching the substrate and the stack structure;

forming a sacrificial gate pattern intersecting the semiconductor structure and extending in a second direction perpendicular to the first direction;

performing a first etching process so that a width in the second direction of the semiconductor structure exposed to at least one side of the sacrificial gate pattern is reduced;

performing a second etching process to remove a portion of the semiconductor structure exposed to the at least one side of the sacrificial gate pattern to form a recess portion exposing an upper surface of the active fin;

performing an epitaxial growth process to form one or more source/drain regions on the active fin on the at least one side of the sacrificial gate pattern;

forming at least one gap region by removing the sacrificial layers and the sacrificial gate pattern; and forming a gate structure by depositing a gate dielectric layer and a gate electrode in the at least one gap region, wherein the active fin comprises a first region overlapping the sacrificial gate pattern and a second region not overlapping the sacrificial gate pattern, wherein an upper surface of the active fin of the first region has a first width in the second direction, wherein, in a cross-section along a third direction that is perpendicular to the first direction and the second direction, the active fin of the second region includes an upper portion having a second width in the second direction and a lower portion having a third width in the second direction, wherein the first width is greater than the second width, wherein the third width is greater than the second width, and wherein the recess portion is between the upper portion and the lower portion of the active fin of the second region in the third direction.

11. The method of claim 10, wherein the performing the first etching process comprises recessing an upper side surface of the active fin of the second region.

12. The method of claim 10, further comprising forming a device separation layer in a region from which a portion of the substrate is removed, wherein the forming the active fin comprises forming a lower side surface of the active fin of the second region to have a first angle with respect to an upper surface of the substrate and forming an upper side surface of the active fin of the second region extending onto the device separation layer to have a second angle different from the first angle with respect to the upper surface of the substrate.

13. The method of claim 10, further comprising forming a device separation layer in a region from which a portion of the substrate is removed, wherein the lower portion of the active fin of the second region is in contact with the device separation layer, and wherein the upper portion of the active fin of the second region extends from the lower portion and protrudes above the device separation layer.

14. The method of claim 10, wherein a portion of the active fin of the second region, which overlaps the one or more source/drain regions in the third direction, has a uniform width in the second direction along the first direction in a plan view.

15. The method of claim 14, wherein the first layers are between the substrate and a lower one of the second layers, between the lower one of the second layers and an intermediate one of the second layers, and between the intermediate one of the second layers and an upper one of the second layers, wherein the first layers are formed of a material having etch selectivity with respect to the second layers, wherein the preliminary channel layers are formed as channel layers by the performing the second etching process, and a width of the channel layers in the second direction is greater than the second width.

16. A method of manufacturing a semiconductor device, the method comprising:

forming a first semiconductor structure extending in a first direction on an NMOS region of a substrate and a second semiconductor structure extending in the first direction on a PMOS region of the substrate;

forming a plurality of sacrificial gate patterns intersecting the first and second semiconductor structures and extending in a second direction perpendicular to the first direction;

forming a plurality of recess portions by removing a portion of the first and second semiconductor structures from at least one side of each of the plurality of sacrificial gate patterns;

forming a plurality of source/drain regions, each of the plurality of source/drain regions in a respective one of the plurality of recess portions;

forming a plurality of gap regions by removing the plurality of sacrificial gate patterns and at least some layers of the first semiconductor structure and/or the second semiconductor structure; and forming at least one gate structure by depositing a gate dielectric layer and a gate electrode in one or more of the plurality of gap regions, wherein at least one of the first and second semiconductor structures provide widths different from each other in the second direction in regions intersecting the plurality of sacrificial gate patterns, wherein the method further comprises:

performing an etching process to reduce a width in the second direction of each of the first and second semiconductor structures exposed to both sides of the plurality of sacrificial gate patterns, after the forming of the plurality of sacrificial gate patterns, and before the forming of the plurality of recess portions, wherein each of the first and second semiconductor structures comprises an active fin extending from the substrate in the first direction, wherein the active fin comprises a first region intersecting one of the sacrificial gate patterns and a second region on an opposite side of the first region in the first direction, wherein the plurality of source/drain regions is on the active fin of the second region, wherein an upper surface of the active fin of the first region has a first width in the second direction, wherein, in a cross-section along a third direction that is perpendicular to the first direction and the second direction, the active fin of the second region includes an upper portion having a second width in the second direction and a lower portion having a third width in the second direction,-and wherein the recess portion is between the upper portion and the lower portion of the active fin of the second region in the third direction, wherein the first width is greater than the second width, and wherein the third width is greater than the second width.

17. The method of claim 16, wherein after the performing the etching process, the first width in the second direction of the active fin of the first region is greater than the second width in the second direction of the active fin of the second region.

18. The method of claim 17, wherein the first width is a minimum width of an upper portion of the active fin of the first region and the second width is a minimum width of the upper portion of the active fin of the second region, wherein a value obtained by subtracting the second width from the first width is about one nanometer (1 nm) or more or about two (2) nm or more.

19. The method of claim 16, wherein the semiconductor device comprises a plurality of transistors providing different channel widths in the NMOS region and a plurality of transistors providing different channel widths in the PMOS region, wherein patterns of the active fin may provide transition regions in which a width in the second direction in a specific region is changed, and wherein a portion of the active fin of the second region, which overlaps a corresponding one of the plurality of source/drain regions in the third direction, has a uniform width in the second direction along the first direction in a plan view.

* * * * *